US007880545B1

(12) United States Patent
Venca et al.

(10) Patent No.: US 7,880,545 B1
(45) Date of Patent: Feb. 1, 2011

(54) CASCODE COMPENSATION CIRCUIT AND METHOD FOR AMPLIFIER STABILITY

(75) Inventors: Alessandro Venca, Alessandria (IT); Daniele Ottini, Pavia (IT); Francesco Rezzi, Pavia (IT); Rinaldo Castello, Arcore (IT)

(73) Assignee: Marvell International Ltd., Hamilton (BM)

( * ) Notice: Subject to any disclaimer, the term of this patent is extended or adjusted under 35 U.S.C. 154(b) by 23 days.

(21) Appl. No.: 12/397,118

(22) Filed: Mar. 3, 2009

Related U.S. Application Data

(60) Provisional application No. 61/038,271, filed on Mar. 20, 2008.

(51) Int. Cl.
*H03F 1/14* (2006.01)
(52) U.S. Cl. ...................................... 330/292; 330/253
(58) Field of Classification Search ................. 330/253, 330/255, 260, 292
See application file for complete search history.

(56) References Cited

U.S. PATENT DOCUMENTS 7,248,117 B1 *   7/2007   Li et al. ....................... 330/260

OTHER PUBLICATIONS

B.K. Ahuja, "An Improved Frequency Compensation Technique for CMOS Operational Amplifiers", IEEE Journal of Solid-State Circuits, vol. 18, Issue 6, Dec. 1983, pp. 629-633.
D.B. Ribner et al, "Design Techniques for Cascoded CMOS Op Amps With Improved PSRR and Common-Mode Input Range", IEEE Journal of Solid-State Circuits, vol. 19, Issue 6, Dec. 1984, pp. 919-925.
R.J. Reay et al., "An Unconditionally Stable Two-Stage CMOS Amplifier", IEEE Journal of Solid-State Circuits, vol. 30, Issue 5, May 1995, pp. 591-594.
M. Yavari et al., "Hybrid Cascode Compensation for Two-Stage CMOS Operational Amplifiers", IEEE Symposium on Circuits and Systems. vol. 2, May 2005, pp. 1565-1568.
Yao Libin, "Fast Settling CMOS Two-Stage Operational Transconductance Amplifiers and Their Systematic Design", IEEE Symposium on Circuits and Systems, vol. 2, May 26-29, 2002, pp. II-839-II-842.
M. Yavari, "Systematic and Optimal Design of CMOS Two-Stage Opamps with Hybrid Cascode Compensation", Proceedings Design, Automation and Test in Europe, vol. 1, Mar. 6-10, 2006, p. 6.

* cited by examiner

*Primary Examiner*—Khanh V Nguyen

(57) ABSTRACT

The present invention provides compensation for circuits. In one embodiment, a compensation circuit has a first terminal coupled to an output terminal of the circuit and a second terminal coupled to feed back the output voltage to an internal node. A damping circuit may also be coupled to the output terminal. The damping circuit adds a pole and a zero to the transfer function of the circuit. In one embodiment, the damping circuit modifies the effect of the output impedance of a load on the transfer function to increase the phase margin of the circuit such that the circuit remains stable over an increased range of output capacitor values.

19 Claims, 13 Drawing Sheets

CASCODE COMPENSATION CIRCUIT AND METHOD FOR AMPLIFIER STABILITY

CROSS REFERENCE TO RELATED APPLICATIONS

This application claims the benefit of priority from U.S. Provisional Application No. 61/038,271, filed Mar. 20, 2008, entitled "Damped Cascoded Compensation Scheme" the entire disclosure of which is hereby incorporated herein by reference.

BACKGROUND

The present invention relates to compensation circuits, and in particular, to cascode compensation circuit and method for amplifier stabilization.

Stability of operational amplifiers, as well as other circuits which may apply feedback, depend on the transfer function of the amplifier circuit. Reactive elements such as capacitors within the amplifier circuit may cause changes in impedances and phase delays in signals propagating through the amplifier circuit. These impedance changes may change amplifier gain and the phase of signals propagating through the circuit as a function of signal frequency.

As signal frequency increases, at some frequency $F_0$, amplifier gains typically fall below unity gain (i.e. below 0 dB) and remain below unity for all frequencies greater the $F_0$. An amplifier circuit that utilizes negative feedback is stable when the open loop phase change associated with $F_0$ is substantially above −180 degrees at unity gain. The phase margin is the difference between the phase associated with $F_0$ and −360 degrees. Accordingly, phase margin is one way of quantifying the stability of an amplifier circuit.

Many amplifier circuits are designed for a target capacitive load. These circuits may be tuned to give a sufficient phase margin to remain stable over a designed bandwidth. The transfer function of the amplifier circuit may change depending on the capacitive load. In some cases, the capacitive load is not exactly the targeted capacitive load and the actual capacitor load may degrade the phase margin of the amplifier circuit and cause peaking in the frequency response. This peaking may degrade the power supply rejection ration (PSRR). Sometimes the capacitive load varies due to part manufacturing variations, for example.

FIG. 1 illustrates an example prior art circuit 100 with cascode compensation. Circuit 100 includes transconductance amplifier 101, resistor $R_1$, resistor $R_0$, capacitor $C_1$, capacitor $C_o$, capacitor $C_A$, transistors 101-106, and current source 104 configured as shown. In this example, circuit 100 uses Ahuja compensation. Ahuja compensation is a cascode compensation scheme used in some amplifier circuits to improve the bandwidth over the well known Miller compensation method. Ahuja compensation boosts the transconductance (gm), and the second pole of its transfer function is moved forward to increase stability. For instance, circuit 100 includes a cascode transistor 103 coupled to capacitor $C_A$ that provides cascode compensation. The cascode compensation allows amplifier circuit 100 to remain stable for a limited range of values of output capacitor $C_0$. However, as illustrated in FIGS. 2 and 3 below, variations in output capacitances outside the above-mentioned range can lead to problems using the prior art circuit.

FIG. 2 illustrates bode plot 200 and a root locus plot 210 of an exemplifying embodiment of the cascoded compensation loop inside the prior art amplifier circuit 100 of FIG. 1 designed in this example to be stable with an output capacitor $C_0$ value of 50 pF. The bode plot 200 includes a gain response 201 and a phase response 202. The behavior of a cascode compensation circuit may be understood by analyzing the open loop gain and associated poles. The open loop gain is as follows:

$$A_V = -\frac{gm_2 R_0}{(1+sR_0 C_{EQ0})} \times \frac{sC_A}{1+s\frac{C_{EQA}}{gm_A}} \times \frac{R_1}{1+sR_1 C_1}, \quad (EQ. 1)$$

where, $$C_{EQA} = \frac{C_A C_0}{C_A + C_0}, \quad C_{EQ0} \cong C_0 + C_A,$$

and the poles are zeros are as follows:

$$z_1 = 0$$

$$P_1 = -\frac{1}{R_1 C_1}$$

$$P_2 = -\frac{1}{R_0 C_{EQ0}}$$

$$P_3 = -\frac{gm_A}{C_{EQA}}$$

The poles and zero above are illustrated in FIG. 2, where the low frequency gain $A_A$ and the GBW_Extrapolated are also illustrated:

$$A_A = \frac{gm_2 R_0 C_A}{C_A}, \text{ and}$$

$$GBW_{Extrapolated} = A_A P_2 = \frac{gm_2 C_{EQA}}{C_{EQ0} C_1}$$

A frequency indicated by line 203 shows a point 204 where the gain response 201 crosses 0 dB and point 205 shows the corresponding phase. Bode plot 200 shows a phase margin of 70 degrees (PM=70°) at 205. The root locus plot 210 shows the movement of the poles and zeros as the loop is closed. The poles and zeros remain on the real axis, and therefore the system is stable at $C_0$=50 pF.

If P3>>P2 as in the example of FIG. 2, then the loop gain equation (EQ. 1) is a good estimation of the more general equation (EQ. 2) as follows:

$$A_V = -\frac{gm_2 R_0 R_1 sC_A}{(1+sR_1 C_1)\left[1+s(C_A+C_0)R_0+s^2\frac{C_A C_0 R_0}{gm_A}\right]} \quad (EQ. 2)$$

Solving the more general expression (EQ. 2) it can be seen that as $C_0$ decreases, the roots P2, P3 move closer in frequency and eventually conjugate, determining as a result, a small phase margin and poor loop stabilization.

FIG. 3 illustrates bode plot 300 and a root locus plot 310 of the open loop response of the cascaded compensation loop inside the prior art amplifier circuit 100 of FIG. 1 with an output capacitor $C_O$ value of 1 pF. Bode plot 300 shows gain $A_A$ and GBW greater than bode plot 200 of FIG. 2. A frequency indicated by line 303 shows a point 304 where the gain response 301 crosses 0 dB and point 305 shows the corresponding phase. Bode plot 300 shows a phase margin of 28 degrees. The root locus plot shows the movement of the poles and zeros as the loop is closed.

Root locus plot 300 shows poles $P_2$ and $P_3$ forming a conjugate pair. In addition to stability risks associated with poor gain margin at the resonant frequency in closed loop configuration, the system may exhibit some ringing at the output or peaking in the frequency response. Peaking is a sudden undesired increase in gain at a particular frequency. The peaking may degrade the power supply rejection ratio (PSRR) of the amplifier circuit 100.

Thus, it would be desirable to provide improved compensation that is less sensitive to variations in output capacitance. The present invention solves these and other problems by providing cascode compensation circuit and method for amplifier stability.

SUMMARY

Embodiments of the present invention improve cascode compensation circuit and method for amplifier stabilization. In one embodiment, the present invention includes an amplifier circuit comprising a transconductance amplifier and a current. The transconductance amplifier is coupled to receive a first and a second input voltage and provide a current corresponding to a difference between said first and second input voltages. The current buffer is coupled to receive said current and provide an output voltage on an output terminal, where the output voltage corresponds to the current. The current buffer includes a compensation circuit having a first terminal coupled to said output terminal and a second terminal coupled to feed back said output voltage to an internal node of said current buffer and a damping circuit coupled to said output terminal, said damping circuit adding a pole and a zero to a transfer function of the amplifier circuit, where the pole and said zero increase a phase margin of said amplifier circuit.

In one embodiment, the damping circuit includes a biasing transistor having a first terminal coupled to said output terminal and a capacitor coupled between said output terminal and a control terminal of said biasing transistor.

In one embodiment, the damping circuit includes a resistor having a first terminal coupled to said control terminal of said biasing transistor.

In one embodiment, the compensation circuit includes a feedback capacitance having a first terminal coupled to said output terminal and a transistor having a first terminal coupled to a second terminal of the feedback capacitance and a second terminal coupled to provide a feedback signal to the internal node, where a control terminal of the transistor is coupled to receive a bias voltage.

In another embodiment, the present invention includes a system comprising the amplifier circuit described herein. The system further comprising a load coupled to the output terminal of the amplifier circuit, where the load comprises a capacitance and an output impedance, and where the pole and zero modify the output impedance.

In another embodiment, the present invention includes a circuit comprising first, second, and third transistors, first and second capacitors, and a resistor. The first transistor has a control terminal to receive a signal, a first terminal coupled to a first reference voltage, and a second terminal coupled to an output terminal. The first capacitor has a first terminal coupled to the output terminal. The second transistor has a first terminal coupled to a second terminal of the first capacitor, a second terminal coupled to the control terminal of the first transistor, and a control terminal coupled to a bias voltage. The third transistor has a first terminal coupled to the output terminal and a second terminal coupled to a second reference voltage. The second capacitor has a first terminal coupled to the output terminal and a second terminal coupled to a control terminal of said third transistor. The resistor has a first terminal coupled to said control terminal of the third transistor.

In another embodiment, the present invention includes a method of compensating a circuit comprising receiving a signal on a first control terminal of a first transistor, coupling the signal to an output terminal through the first transistor, coupling the signal at the output terminal to a first terminal of a second transistor through a capacitor, coupling the signal at the first terminal of the second transistor through the second transistor to the control terminal of the first transistor, coupling the signal at the output terminal to a load, and coupling the signal at the output terminal to a damping circuit comprising a capacitor and a resistor.

The following detailed description and accompanying drawings provide a better understanding of the nature and advantages of the present invention.

DETAILED DESCRIPTION

Described herein are cascode compensation circuit and method for amplifier stabilization. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 4:
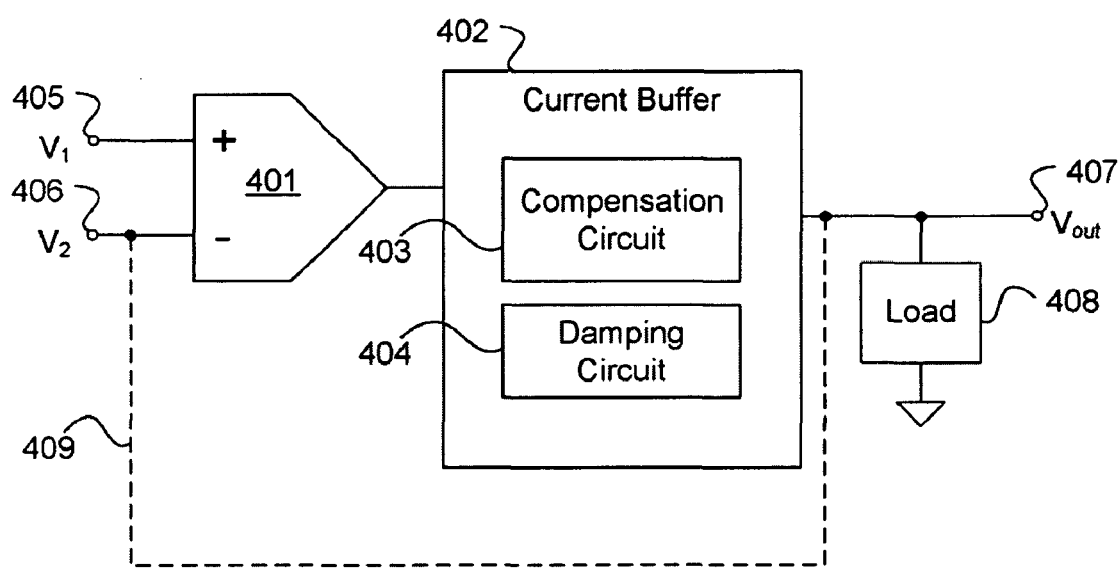
FIG. 4 illustrates a block diagram of an amplifier circuit according to one embodiment of the present invention.

FIG. 4 illustrates a block diagram of an amplifier circuit 400 that may benefit from embodiments of the present invention. Amplifier circuit 400 includes a transconductance amplifier 401 and a current buffer 402. Amplifier circuit 400 amplifies a difference between voltage signal V1 at input terminal 405 and voltage signal V2 at input terminal 406 and provides a voltage $V_{out}$ at output terminal 407. Amplifier circuit 400 may utilize negative feedback connection 409 to control the gain of amplifier circuit 400. Amplifier circuit 400 utilizes compensation circuit 403 and damping circuit 404 to stabilize the amplifier circuit 400.

Transconductance amplifier 401 amplifies a difference between voltage signal V1 at input terminal 405 and voltage signal V2 at input terminal 406 and provides a current to current buffer 402. Current buffer 402 converts the current into output voltage $V_{out}$. Current buffer 402 includes compensation circuit 403 and damping circuit 404.

Compensation circuit 403 and damping circuit 404 provide stability for amplifier circuit 400 over a range of loads. For example, load 408 may include a capacitive load of 10 fF to 1 nF, and compensation circuit 403 and damping circuit 404 maintain a phase margin between voltage signal V1 and voltage signal V2 such that amplifier circuit 400 maintains stability.

Compensation circuit 403 modifies the gain and phase characteristics of amplifier circuit 400. This modification allows for stability for a target capacitive load range. The compensation circuit 403 and damping circuit 404 provide an internal feedback signal and compensation loop, and the compensation loop includes a transfer function. The transfer function of the compensation loop may include a zero and multiple poles due to the compensation circuit 403 and an additional pole and zero contributed by the damping circuit 404. The compensation loop, including compensation circuit 403 and damping circuit 404, may be designed for a specific target load range, which may allow for amplifier circuit 400 to be stable for a range of capacitor values. Damping circuit 404 modifies the transfer function of the compensation circuit 403 to maintain stability over an increased range of capacitance values. In particular, the pole and zero added by damping circuit 404 modify the effective impedance at the output terminal 407 under AC conditions, thus reducing the sensitivity to lower values of load capacitance.

Figure 5:
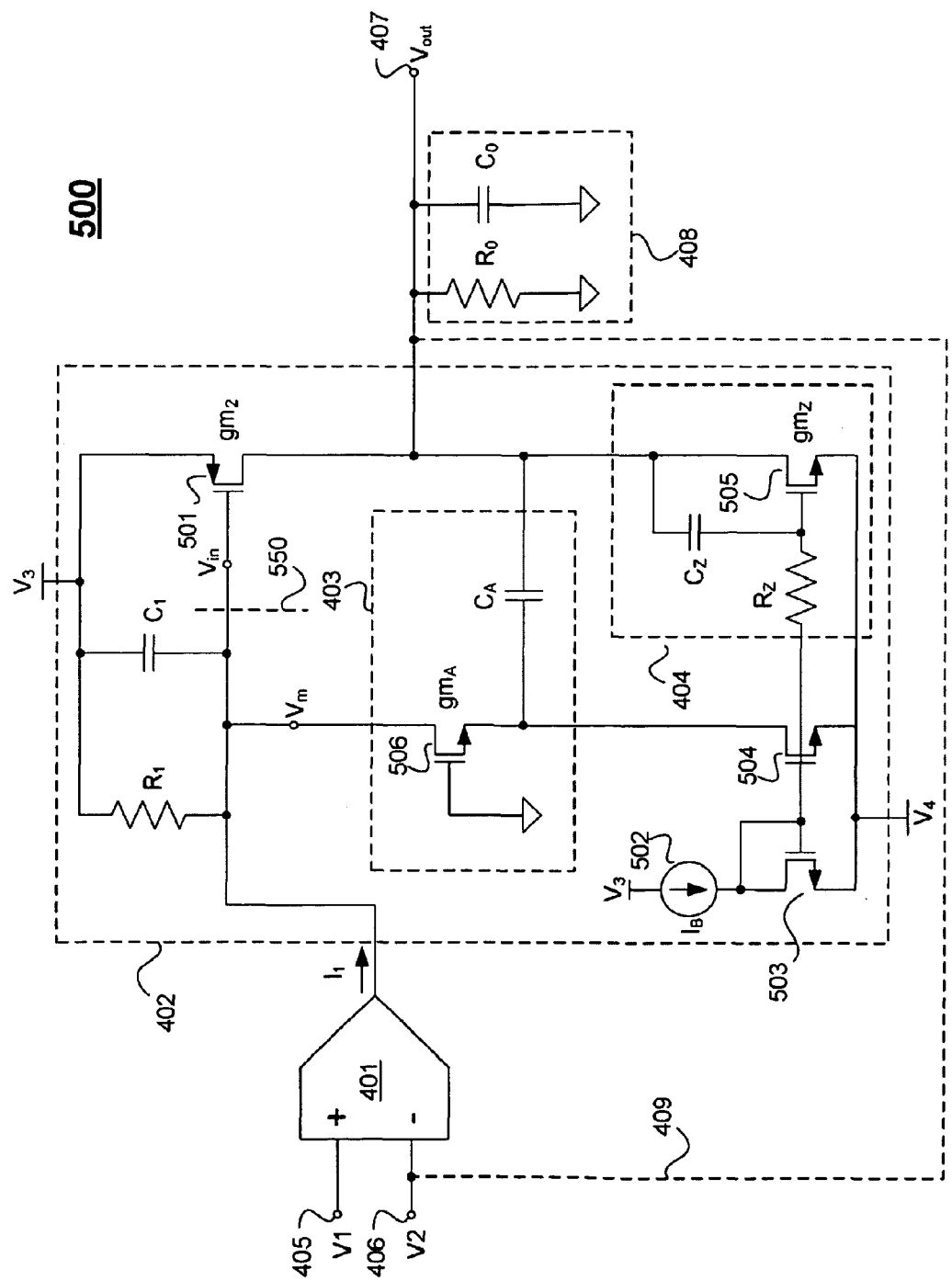
FIG. 5 illustrates an amplifier circuit according one embodiment of the present invention.

FIG. 5 illustrates an example amplifier circuit 500 according one embodiment of the present invention. Amplifier circuit 500 includes transconductance amplifier 401, current buffer 402 and load 408. Transconductance amplifier 401 generates a current $I_1$ as described above. The output of amplifier 401 is coupled to the input of current buffer 402. Current buffer 402 converts a current $I_1$ to an output voltage $V_{out}$. The control terminal of a transistor 501 is shown coupled to one terminal of a resistor $R_1$ and one terminal of a capacitor $C_1$, which may be the equivalent output resistance and capacitance of amplifier 401, for example. The other terminal of resistor $R_1$ and the other terminal of capacitor $C_1$ is coupled to reference voltage $V_3$. A first terminal of transistor 501 is coupled to reference voltage $V_3$. A second terminal of transistor 501 is coupled to output terminal 407 and provides the output voltage $V_{out}$. Accordingly, current $I_1$ into resistor $R_1$ and capacitor $C_1$ generate a voltage at a control terminal of transistor 501. The voltage at the control terminal of transistor 501 is converted to a current, which generates a voltage Vout in accordance with the output impedance of the current buffer 402. Transistor 501 has transconductance $gm_2$.

Compensation circuit 403 includes transistor 506 configured in cascode and coupled to the output through a capacitor $C_A$. Transistor 506 has transconductance $gm_4$. One terminal of capacitor $C_A$ is coupled to output terminal 407 and the other terminal of capacitor $C_A$ is coupled to a first terminal of transistor 506. A second terminal of transistor 506 is coupled to the control terminal of transistor 501. The control terminal of transistor 506 is coupled to a reference voltage (e.g. 0V or ground). The first terminal of transistor 506 is coupled to receive bias current, such as current $I_B$ (or a fraction or multiple thereof) from transistor 504 as described below.

Features and advantages of the present invention include providing a damping circuit to change the output impedance of the circuit. In this example, transistor 505 has a first terminal coupled to provide biasing to the second terminal of transistor 501 at the output terminal. Transistor 505 has transconductance $gm_Z$. Transistors 503, 504, and 505 are configured to form a current mirror to generated the bias currents. A current source 502 sources current $I_B$ through transistor 503, which is configured as a diode. The control terminal of transistor 503 is coupled to the control terminals of transistors 504 and 505 such that the bias current provided by each transistor equals $I_B$. In alternate embodiments, either of the bias currents provided by transistor 504 for transistor 506, or transistor 505 for transistor 501, may be a fraction or a multiple of bias current $I_B$.

Load 408 includes a capacitance $C_0$ and a resistance $R_0$ in parallel and each having a first terminal coupled to output terminal 407 and a second terminal coupled to ground.

Damping circuit 404 includes transistor 505, a capacitor $C_Z$ and a resistor $R_Z$. Capacitor $C_Z$ has one terminal coupled to output terminal 407 and another terminal coupled to a control terminal of transistor 505. Resistor $R_Z$ couples the control terminal of transistor 505 to the control terminals of transistors 503 and 504. An effective capacitance at the output terminal 407 is modified by transistor 505 multiplying the capacitance $C_Z$. Transistor 505, capacitor $C_Z$, and resistor $R_Z$ contribute to modifying the effective impedance at the output terminal 407.

Figure 6A:
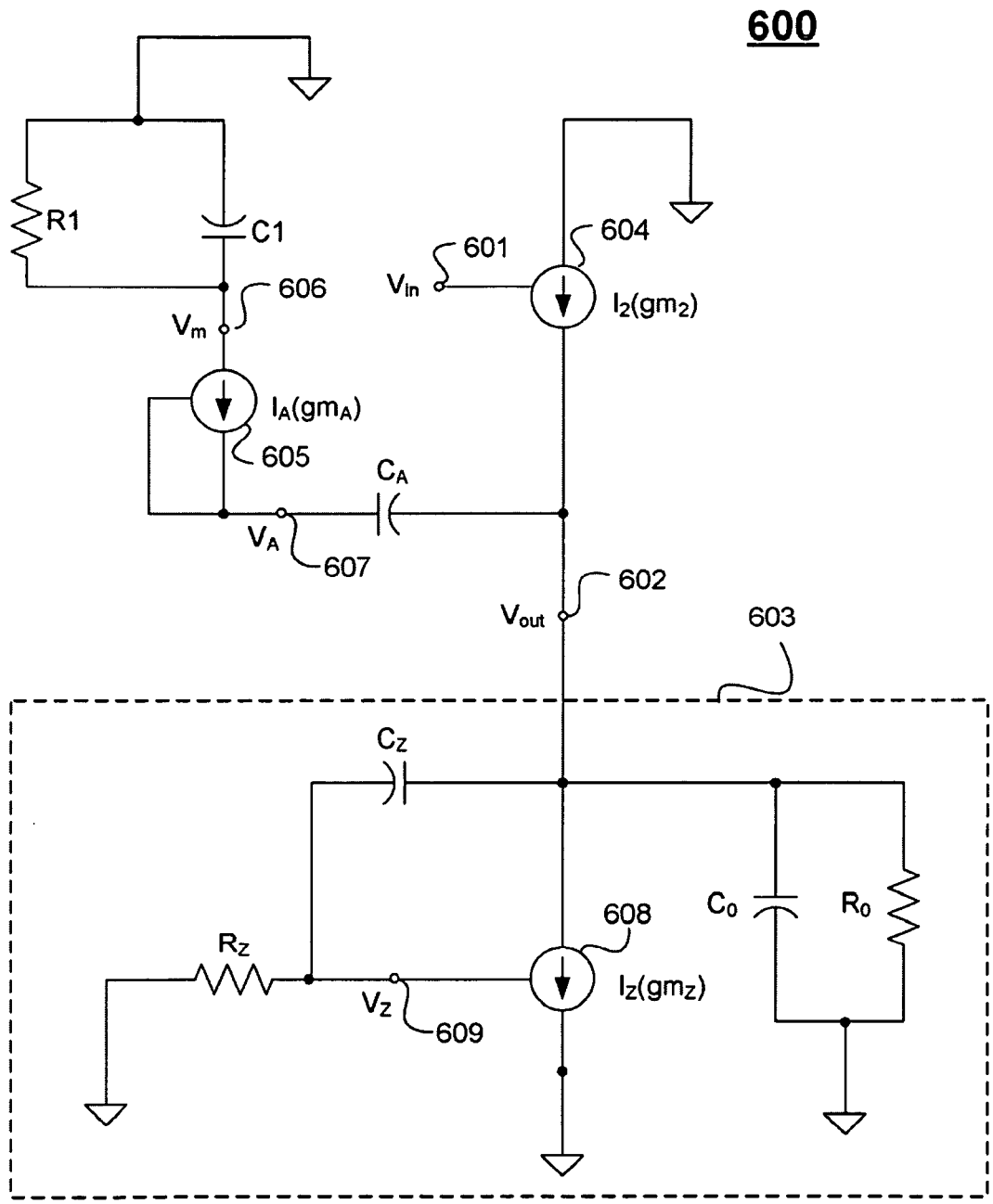
FIG. 6A illustrates an AC model of the amplifier circuit of FIG. 5 used to evaluate the open loop response of the cascaded compensation loop.

FIG. 6A illustrates an AC circuit model 600 of the amplifier circuit of FIG. 5 used to evaluate the open loop response of the cascaded compensation loop. Understanding the behavior of the loop may be determined by breaking the loop of circuit 500 at line 550, providing an input signal at terminal Vin, and examining the resultant signal at node $V_m$. AC circuit model 600 includes capacitor $C_1$, resistor $R_1$, dependent current source 604 for modeling transistor 501, dependent source 605 for modeling transistor 506, capacitor CA, and output impedance 603 (Zout). Resistor $R_1$ has one terminal coupled to ground and a second terminal coupled to node Vm. Capacitor $C_1$ is coupled in parallel with resistor $R_1$. Dependant current source 605 is coupled to sink current from node 606 and coupled to source current to one terminal of capacitor $C_A$. The other terminal of capacitor $C_A$ is coupled to node 602.

A signal Vin is supplied to node 601. Dependent source 604 generates current $I_2$ according to transconductance $gm_2$ and signal Vin. Current $I_2$ is coupled to load 603 and to node 606 through capacitor $C_A$ and dependant source 605. Dependant source 605 generates a current $I_A$ according to transconductance $gm_A$ and a voltage $V_A$ at node 607.

Node 602 is also coupled to output impedance circuit 603 (Zout). Node 602 is coupled to one terminal of capacitor $C_Z$, a terminal of dependent current source 608, one terminal of output capacitor Co, and one terminal of output resistor $R_0$. The other terminal of output capacitor $C_0$ and output resistor $R_0$ is coupled to ground. A second terminal of dependent current source 608 is coupled to ground. Current $I_Z$ is generated according to transconductance gmZ and a voltage $V_Z$ at node 609. Node 609 is coupled to the other terminal of capacitor $C_Z$ and one terminal of resistor $R_Z$. The other terminal of $R_Z$ is coupled to AC ground.

Figure 6B:
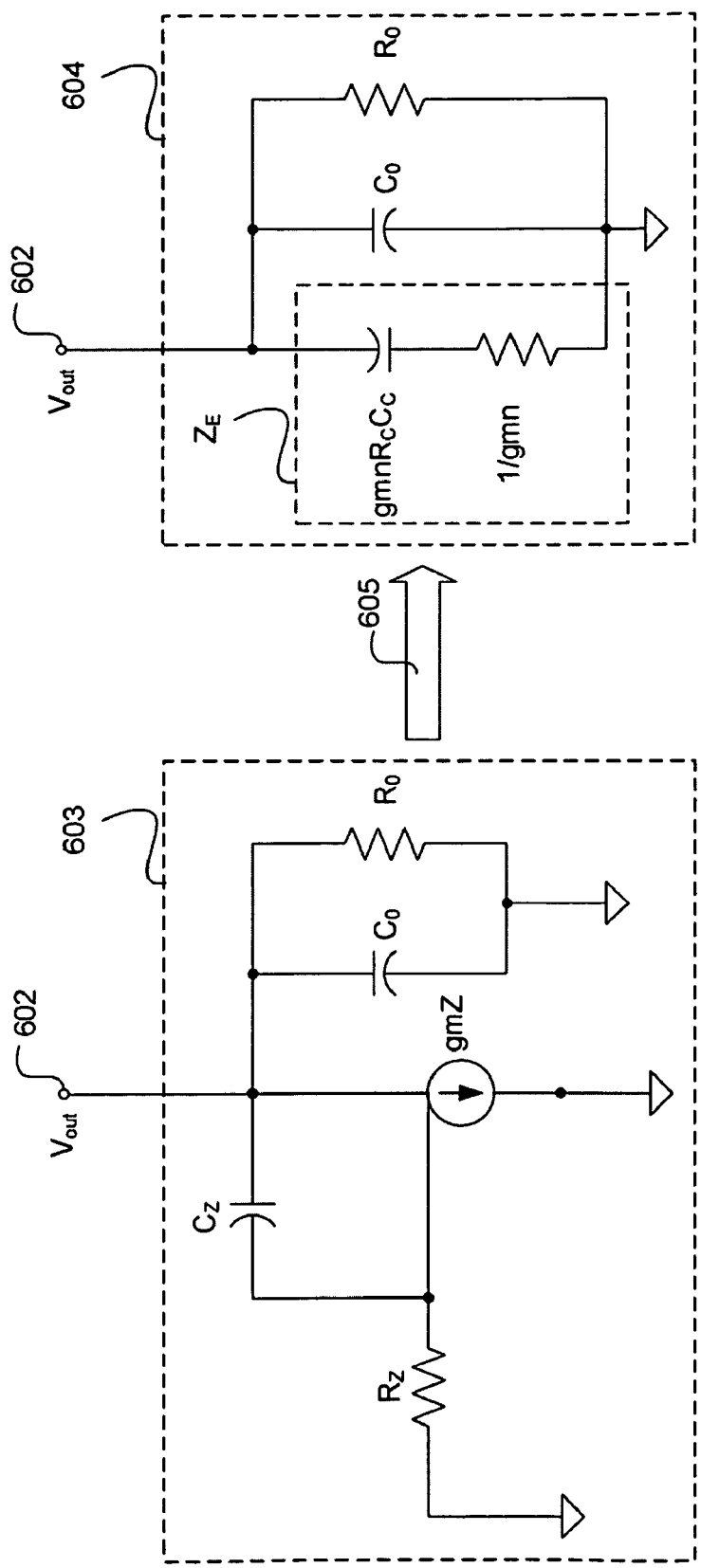
FIG. 6B illustrates the AC model of output impedance and a corresponding equivalent output impedance utilized in the AC model of FIG. 6A.

FIG. 6B illustrates the AC model of output impedance circuit 603 and a corresponding equivalent output impedance circuit 604 utilized in AC circuit model 600 of FIG. 6A. Output impedance circuit 603 is similar to that shown in FIG. 6A.

Arrow 605 indicates a translation of output impedance circuit 603 to equivalent output impedance circuit 604. Equivalent output impedance circuit 604 includes an equivalent impedance $Z_E$ in parallel with output capacitor $C_0$ and output capacitor $R_0$. Impedance $Z_E$ includes a capacitance equal to $gmnR_ZC_Z$ in series with a resistance equal to 1/gmz.

Figure 7:
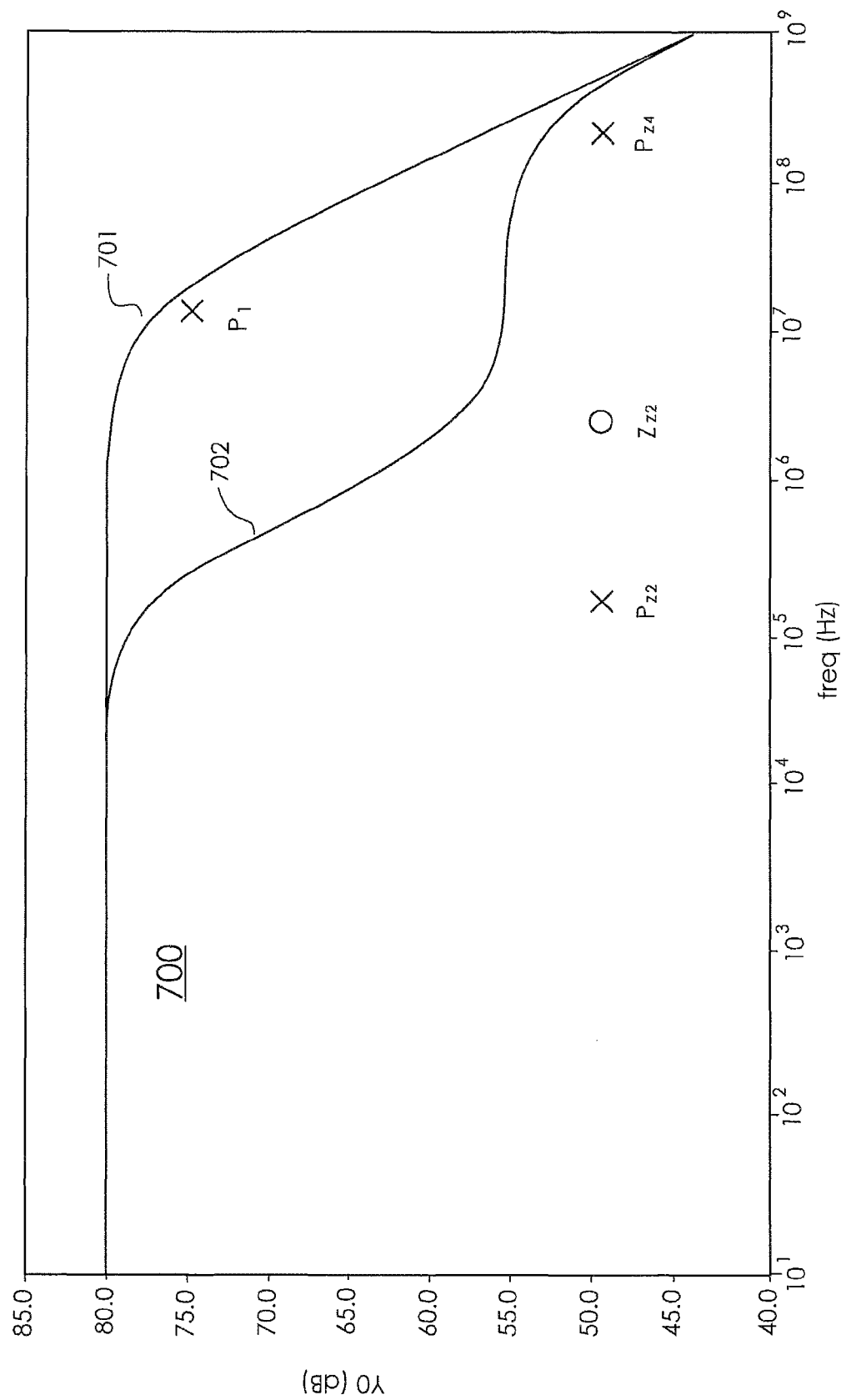
FIG. 7 illustrates a plot 700 of the output impedance 604 over frequency.

FIG. 7 illustrates a plot 700 of the output impedance 604 over frequency. Curve 701 indicates a characteristic in which $C_Z$ and $R_Z$=0 and the output impedance is based on capacitor $C_0$ and resistor $R_0$ in parallel. Capacitor $C_0$ and resistor $R_0$ of FIG. 6B contribute to a single pole $P_2$ of characteristic 701. The pole $P_2$ is listed below.

$$P_2 = -\frac{1}{R_0 C_0}$$

Curve 702 indicates a characteristic 702 in which $C_Z$ and $R_Z$ are added to the circuit, and the output impedance includes impedance $Z_E$, output capacitor $C_0$, and output resistor $R_0$ coupled in parallel. Impedance $Z_E$ contributes two additional poles $P_{Z2}$ and $P_{Z4}$ and zero $Z_Z$ to modify the output impedance of the circuit. The poles and zeros for characteristic 702 are listed below.

$$P_{Z2} = -\frac{1}{gm_Z R_0 R_Z C_Z}$$

$$Z_{Z2} = -\frac{1}{R_Z C_Z}$$

$$P_{Z4} = -\frac{gmZ}{C_0}$$

The addition of the pole $P_{Z2}$ and zero $Z_{Z2}$ by impedance $Z_E$ allows the output gain $A_A$ to drop out at a lower frequency set by $P_{Z2}$, and the zero $Z_{Z2}$ will cancel the effect of pole $P_{Z2}$ at some higher frequency. The damping circuit pole $P_{Z2}$ and zero $Z_{Z2}$ are included in the transfer function of the compensation circuit and improve stability by avoiding $P_{Z2}$, $P_{Z4}$ to conjugate since the zero $Z_{Z2}$ has been introduced between the two poles. Differently as for the case of previous art, as $C_0$ decreases, the pole $P_3$ is not moving anymore towards $P_{Z2}$ but is pushed forward in frequency by the zero $Z_{Z2}$ improving therefore stability performances. In this example, the damping circuit pole/zero pair are introduced by damping the output load re-using the OTA output stage current source gmz and a new Cz and Rz connected as shown in the small signal model.

The location at which to introduce the pole $P_{Z2}$ and zero $Z_{Z2}$ may be based on the following design considerations. $Z_{Z2}$ is the frequency where $P_{Z2}$ will move once the cascode compensation loop is closed and it represents the secondary pole for the amplifier open loop response. For this reason $R_Z$, $C_Z$, and $gm_Z$ should be chosen such that the zero $Z_{Z2}$ is located at a frequency enough higher than the unity gain bandwidth frequency of the amplifier to guarantee the amplifier stability. This would place zero $Z_{Z2}$ two or three times above the unity gain bandwidth of the overall operational amplifier transfer function. In the following plots the PZ2, PZ4 ZZ2 are renamed P2, P4, Z2 respectively to simplify the symbolism.

Figure 8:
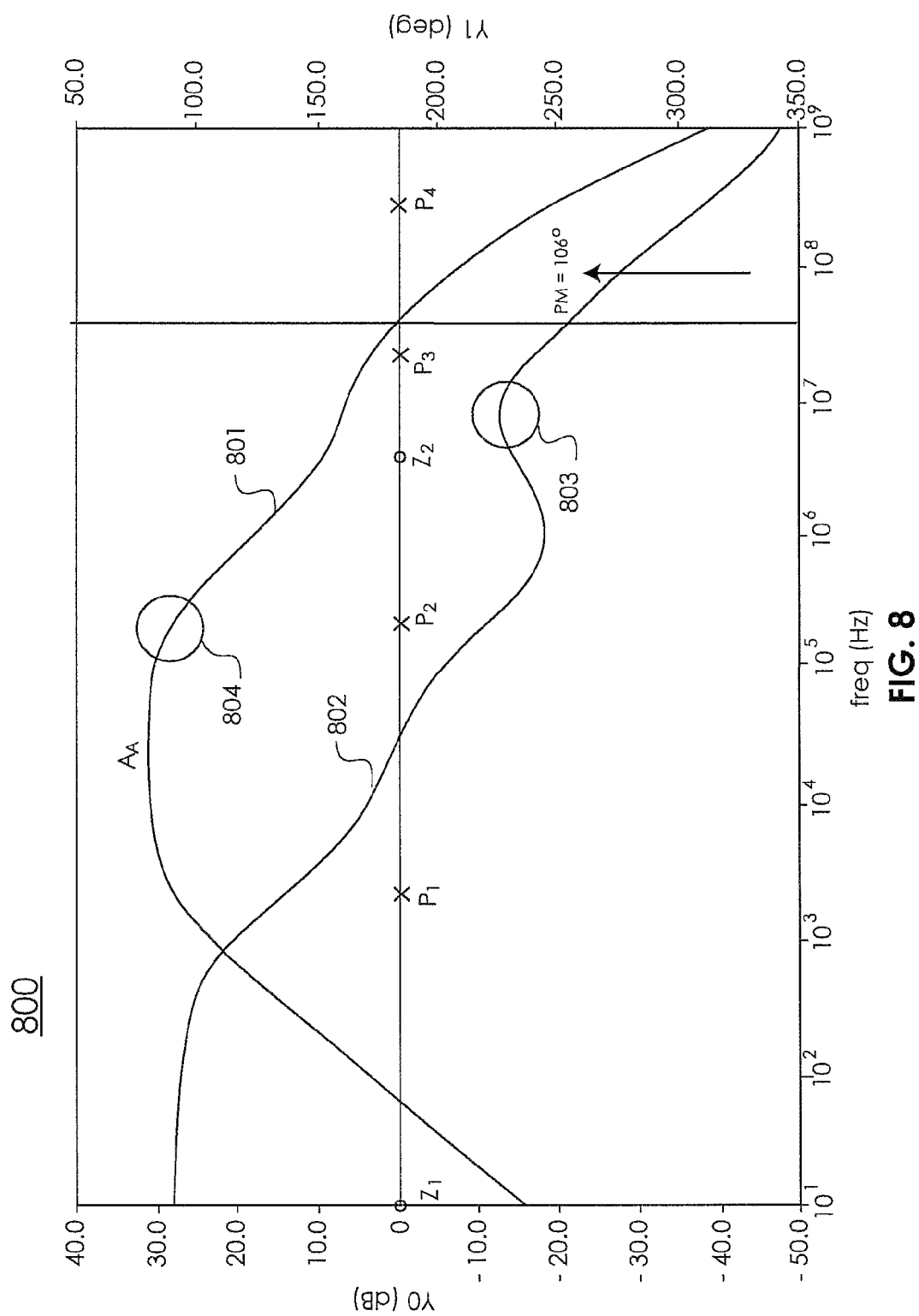
FIG. 8 illustrates a bode plot of the open loop response of the amplifier of FIG. 5 with an output capacitor value of 1 pF.

FIG. 8 illustrates a bode plot 800 of the open loop response of the amplifier of FIG. 5 with an output capacitor value of 1 pF. Bode plot 800 includes a magnitude 801 and a phase shift 802 corresponding to amplifier circuit 500. Bode plot 800 indicates the relative positions of poles $P_1$-$P_4$ and zeros $Z_1$-$Z_2$. The equations for these poles and zeros have been described above.

Pole $P_2$ reduces the magnitude 801 from $A_A$ at location 804. Zero $Z_2$ reduces the reduces the phase shift 802 at location 803 and improves the phase margin. In this example, the phase margin is 106 degrees.

Figure 9:
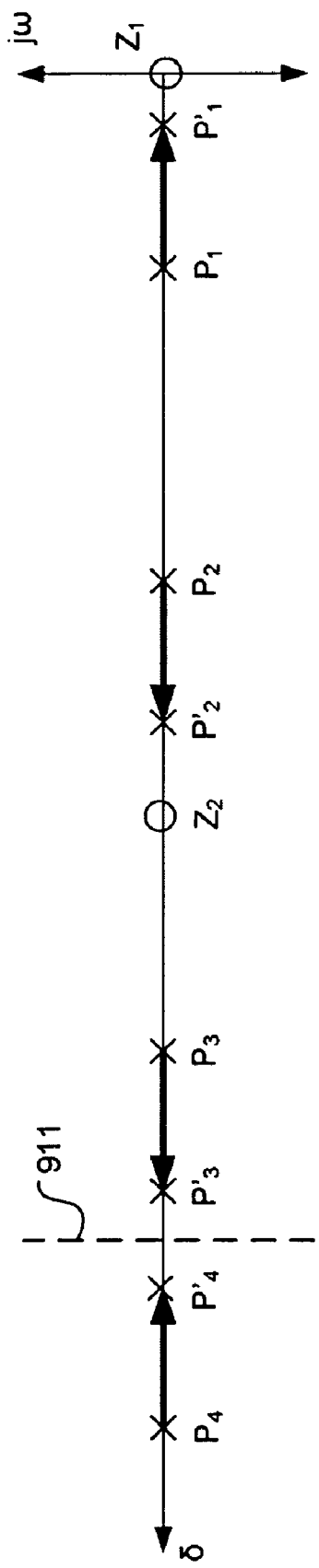
FIG. 9 illustrates a root locus plot of the open loop response of the amplifier of FIG. 5 with an output capacitor value of 1 pF.

FIG. 9 illustrates a root locus plot 910 of the open loop response of the amplifier of FIG. 5 with an output capacitor value of 1 pF. Root locus plot 910 includes poles $P_1$-$P_4$ and zeros $Z_1$-$Z_2$. The movement of the poles illustrates the change in the circuits behavior when the compensation loop is closed. Pole $P_1$ moves to position P'1 and remains on the real axis. Poles P3 and P4 move toward each other, eventually meeting and conjugating at point 911 which is at frequency much higher than the unity GBW of the amplifier. Since pole P3 is pushed away from the unity GBW of the amplifier and P2 has been placed at a frequency enough higher than the unity GBW of the amplifier, the stability performances of circuit 500 of FIG. 5, loaded by C0=1 pF, is greatly improved with respect to previous art.

Figure 1:
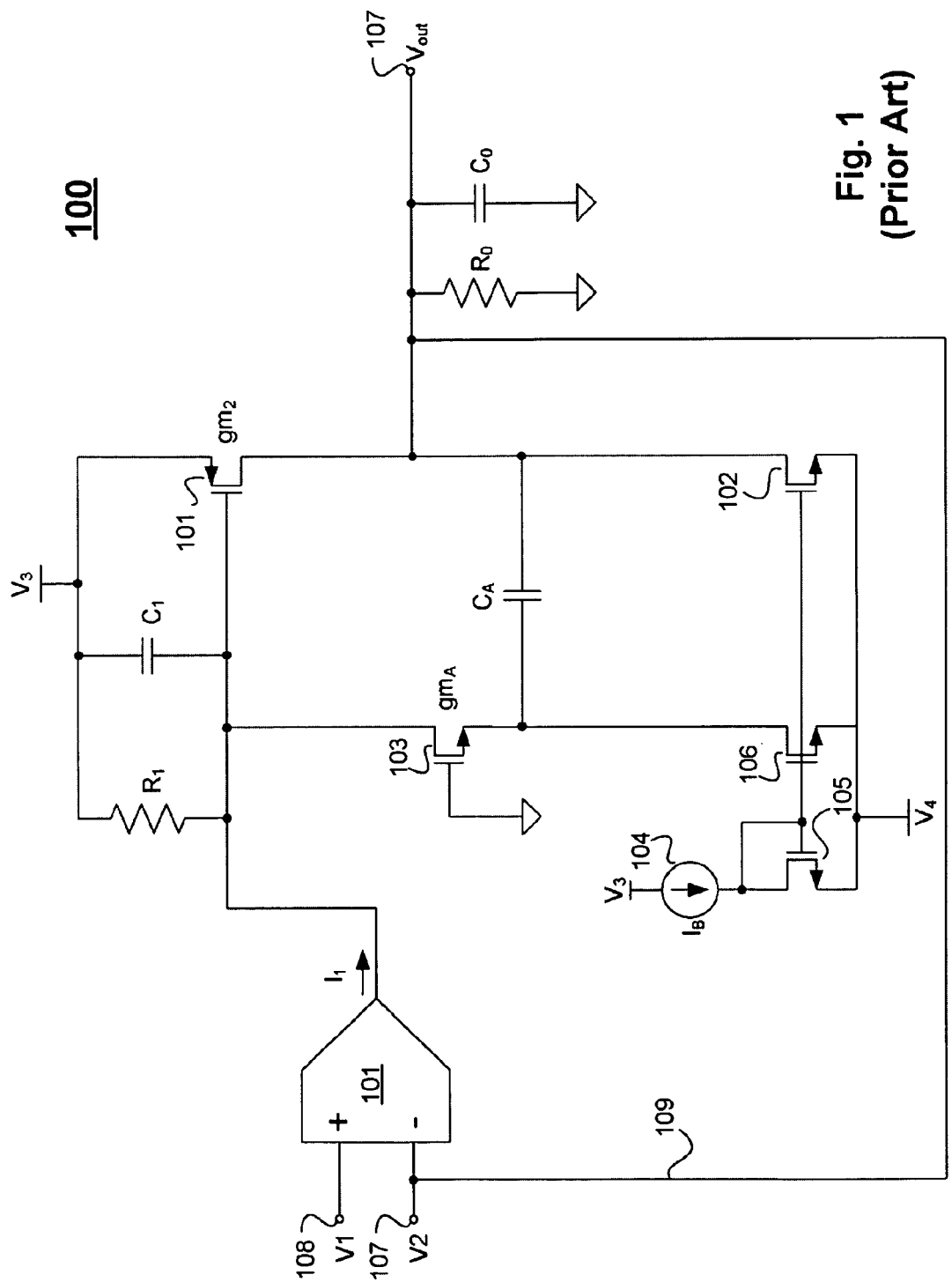
FIG. 1 illustrates a prior art amplifier circuit utilizing Ahuja compensation.
Figure 2:
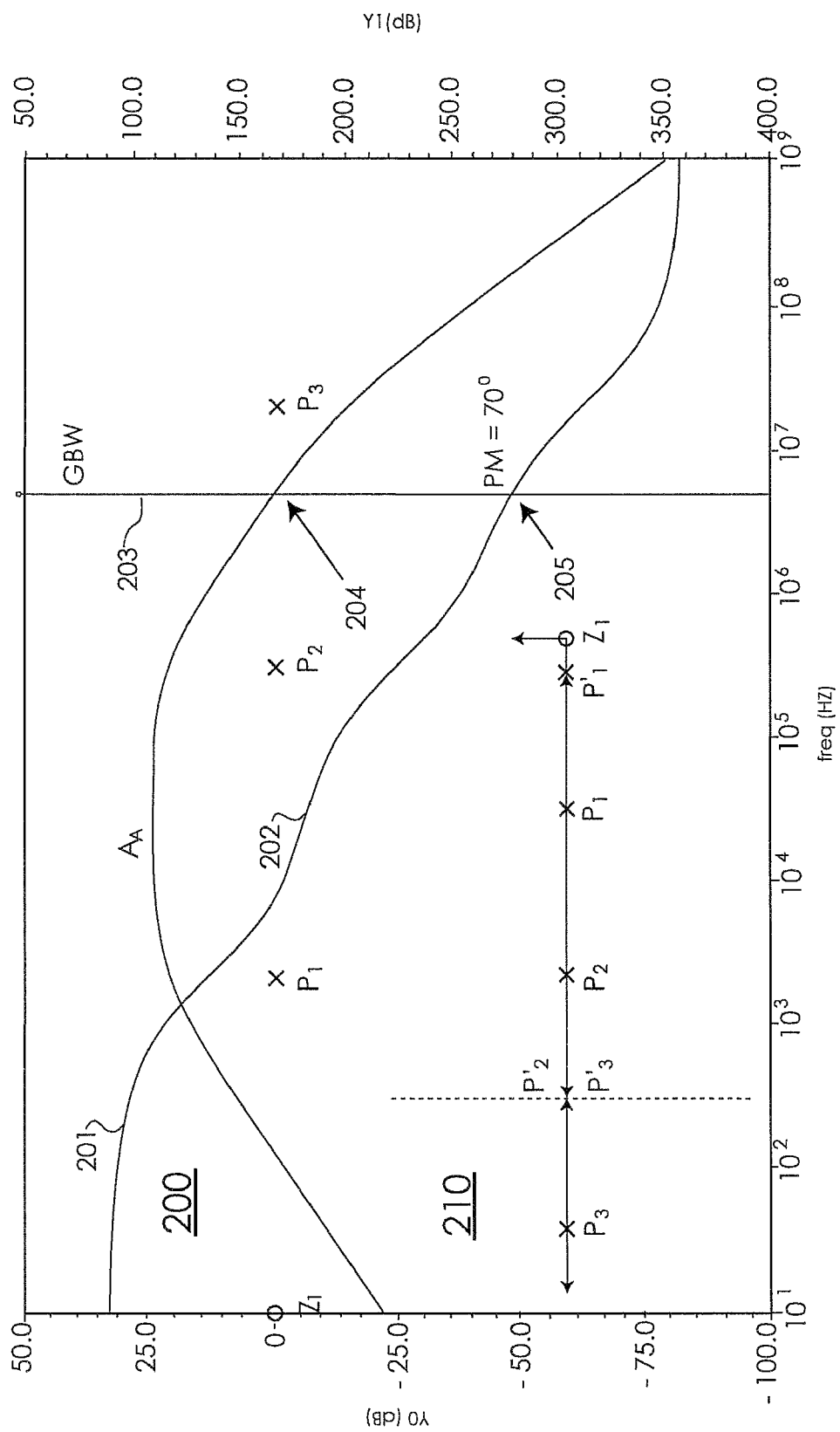
FIG. 2 illustrates a bode plot and a root locus plot of the cascaded compensation loop inside the open loop response of the prior art amplifier circuit of FIG. 1 with an output capacitor value of 50 pF.
Figure 3:
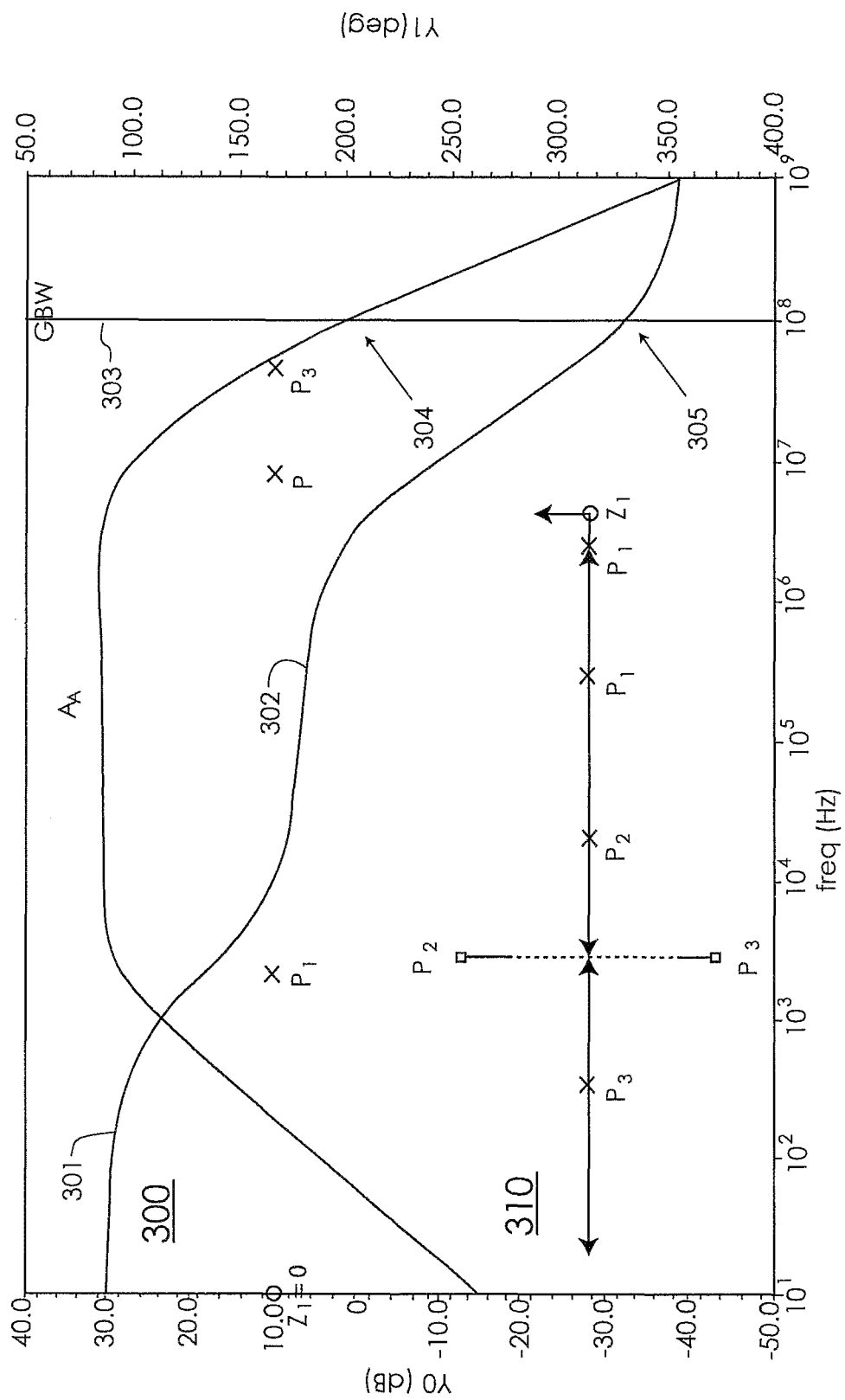
FIG. 3 illustrates a bode plot and a root locus plot of the cascaded compensation loop inside the open loop response of the prior art amplifier circuit of FIG. 1 with an output capacitor value of 1 pF.
Figure 10:
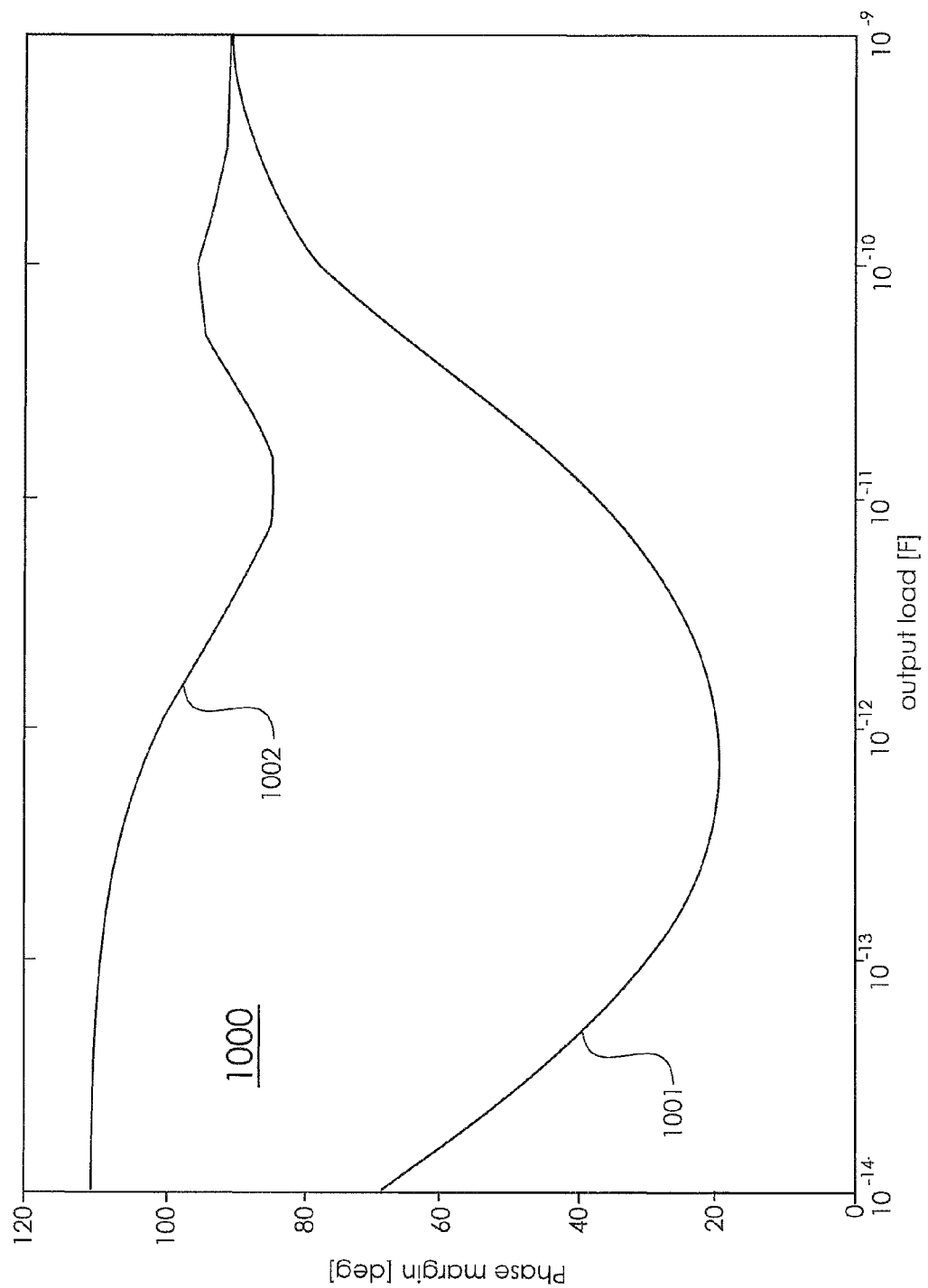
FIG. 10 illustrates a graph showing the phase margin across a range of output capacitor values for the prior art amplifier circuit of FIG. 1 and for the amplifier circuit of FIG. 5.

FIG. 10 illustrates a graph 1000 showing the phase margin across a range of output capacitor values for the cascaded compensation loop inside amplifier circuit 100 of FIG. 1 and for the damped cascaded compensation loop inside amplifier circuit 500 of FIG. 5. Graph 1000 includes curve 1001 corresponding to amplifier circuit 100 of FIG. 1 and curve 1002 corresponding to amplifier circuit 500 of FIG. 5. According to curve 1002, the damped cascoded compensation loop of amplifier circuit 500 maintains a phase margin above 80 degrees over the range of output capacitor values of 10 fF to 1 nF. Curve 1002 corresponding to amplifier circuit 500 of FIG. 5 is an improvement over curve 1001 corresponding to amplifier circuit 100 of FIG. 1.

Figure 11A:
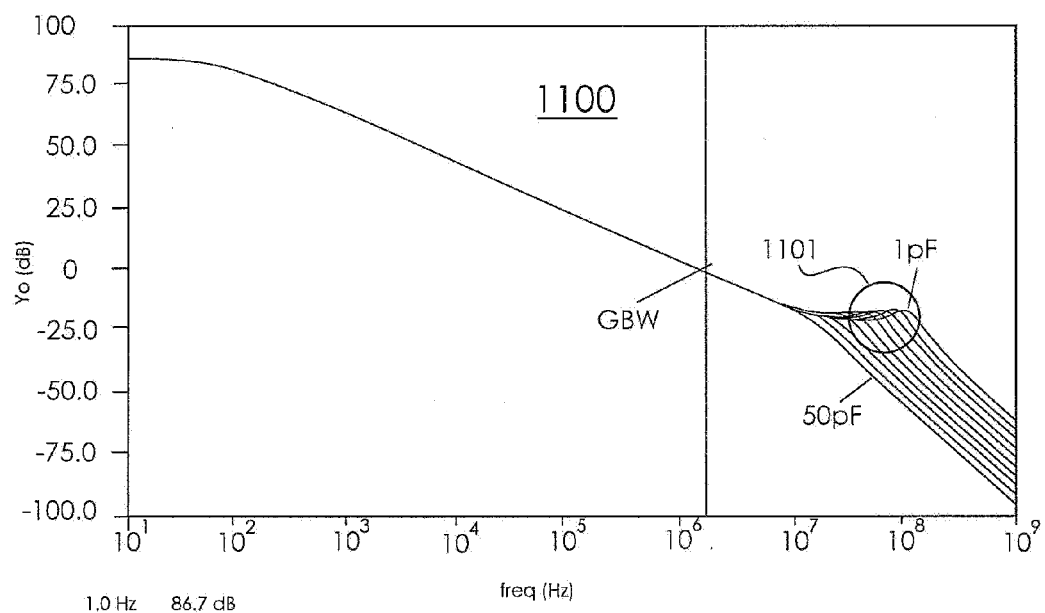
FIG. 11A illustrates bode plots of the open loop gain of the amplifier circuit of FIG. 1 which includes transconductance amplifier stage.

FIG. 11A illustrates bode plots of the open loop gain 1100 of the amplifier circuit 100 of FIG. 1 which includes transconductance amplifier stage 101. The bode plots 1100 show a range of output capacitor values from 50 pF to 1 pF. Location 1101 indicates peaking due to the conjugated poles P2, P3.

Figure 11B:
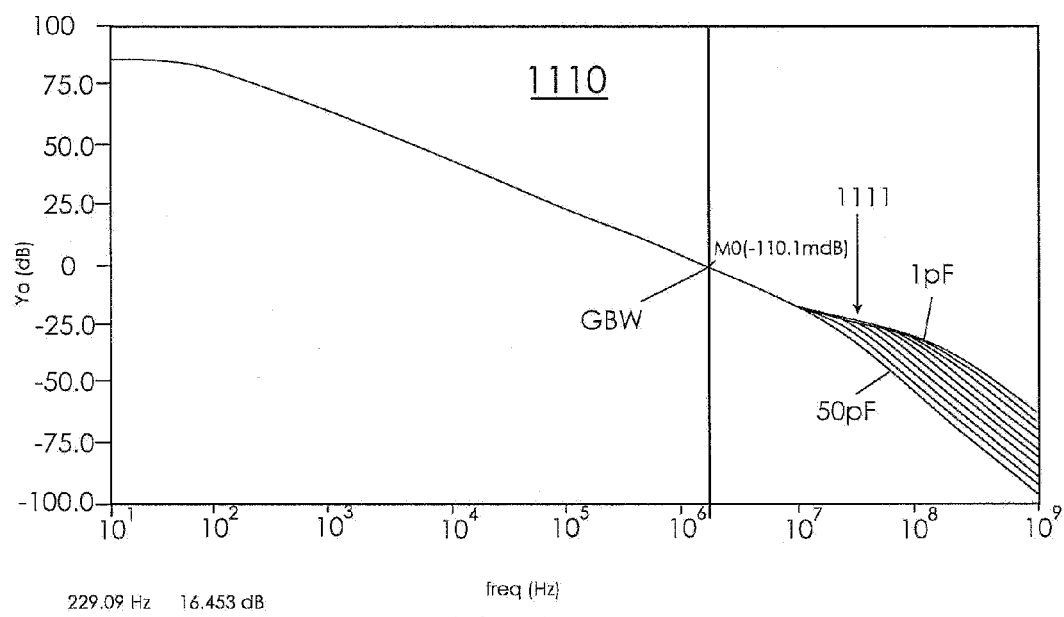
FIG. 11B illustrates bode plots of the open loop gain of the amplifier circuit of FIG. 5 which includes transconductance amplifier stage.

FIG. 11B illustrates bode plots of the open loop gain 1110 of the amplifier circuit 500 of FIG. 5 which includes transconductance amplifier stage 501. The bode plots 1110 show a range of output capacitor values from 50 pF to 1 pF. Location 1111 shows the location where peaking has been reduced or damped out since P2, P3 do not conjugate. The reduced peaking reduces the effect of power supply variations on the output and improves the power supply rejection ration (PSRR) of amplifier circuit 500.

Figure 12:
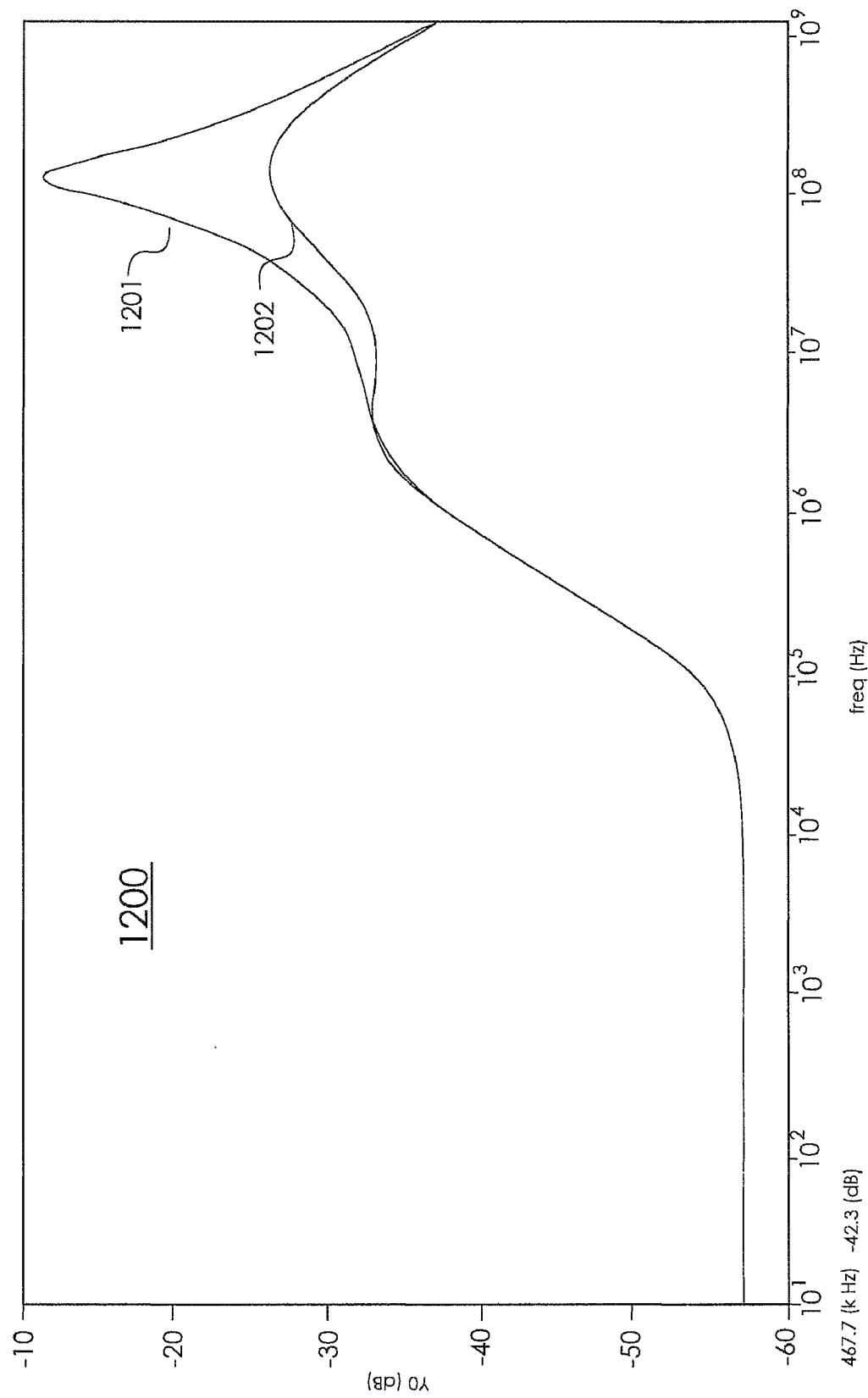
FIG. 12 illustrates a bode plot of the PSRR for the amplifier circuit of FIG. 1 and for the amplifier circuit of FIG. 5.

FIG. 12 illustrates a bode plot of the PSRR 1200 for the amplifier circuit 100 of FIG. 1 and for the amplifier circuit 500 of FIG. 5. Bode plot 1200 includes curve 1201 of the PSRR of circuit 100 of FIG. 1 and curve 1202 of the PSRR of circuit 500 of FIG. 5. Curve 1201 exhibits a peaking behavior due to the conjugated poles P2 and P3. Curve 1202 shows no peaking and consequently a lower PSRR than curve 1201.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the scope of the invention as defined by the claims.

What is claimed is:

1. An amplifier circuit comprising:
    a transconductance amplifier coupled to receive a first input voltage and a second input voltage, the transconductance amplifier providing a current corresponding to a difference between the first input voltage and the second input voltage; and
    a current buffer coupled to receive the current and provide an output voltage on an output terminal, the output voltage corresponding to the current, the current buffer comprising:
        a compensation circuit having (i) a first terminal coupled to the output terminal and (ii) a second terminal coupled to feed back the output voltage to an internal node of the current buffer, and
        a damping circuit coupled to the output terminal, the damping circuit adding a pole and a zero to a transfer function of the amplifier circuit, wherein the pole and the zero increase a phase margin of the amplifier circuit.

2. The amplifier circuit of claim 1 wherein the damping circuit includes:
    a biasing transistor having a first terminal coupled to the output terminal; and
    a capacitor coupled between the output terminal and a control terminal of the biasing transistor.

3. The amplifier circuit of claim 2 wherein the damping circuit includes:
    a resistor having a first terminal coupled to the control terminal of the biasing transistor.

4. The amplifier circuit of claim 1 wherein the compensation circuit includes:
    a feedback capacitance having a first terminal coupled to the output terminal; and
    a transistor having (i) a first terminal coupled to a second terminal of the feedback capacitance and (ii) a second terminal coupled to provide a feedback signal to the internal node,
    wherein a control terminal of the transistor is coupled to receive a bias voltage.

5. A system comprising the amplifier circuit of claim 1, the system further comprising a load coupled to the output terminal of the amplifier circuit, wherein the load comprises a capacitance and a corresponding output impedance, and wherein the pole and the zero modify the output impedance.

6. The system of claim 5 wherein the capacitance has a value within a range from 10 fF to 1 nF.

7. The system of claim 6 wherein the amplifier circuit maintains more than 80 degrees of phase margin for the capacitance having a value within the range.

8. A circuit comprising:
    a first transistor having (i) a control terminal to receive a signal, (ii) a first terminal coupled to a first reference voltage, and (iii) a second terminal coupled to an output terminal;
    a first capacitor having a first terminal coupled to the output terminal;
    a second transistor having (i) a first terminal coupled to a second terminal of the first capacitor, (ii) a second terminal coupled to the control terminal of the first transistor, and (iii) a control terminal coupled to a bias voltage;
    a third transistor having (i) a first terminal coupled to the output terminal and (ii) a second terminal coupled to a second reference voltage;
    a second capacitor having (i) a first terminal coupled to the output terminal and (ii) a second terminal coupled to a control terminal of the third transistor; and
    a resistor having a first terminal coupled to the control terminal of the third transistor.

9. The circuit of claim 8 further comprising a fourth transistor having a first terminal coupled to the first terminal of the second transistor, and wherein the fourth transistor is configured to provide a bias current to the second transistor.

10. The circuit of claim 8 wherein a second terminal of the resistor is coupled to a current source.

11. A method of compensating a circuit comprising:
    receiving a signal on a control terminal of a first transistor;
    coupling the signal to an output terminal through the first transistor;
    coupling the signal at the output terminal to a first terminal of a second transistor through a first capacitor;
    coupling the signal at the first terminal of the second transistor through the second transistor to the control terminal of the first transistor;
    coupling the signal at the output terminal to a load; and
    coupling the signal at the output terminal to a damping circuit comprising a second capacitor and a resistor,
    wherein the second capacitor and the resistor introduce a pole and a zero into a transfer function of the circuit.

12. The method of claim 11 wherein the second capacitor and the resistor modify an impedance of the load.

13. The method of claim 11 wherein the second capacitor and the resistor are configured to produce the zero proximate to and above a gain bandwidth product of the circuit.

14. A method of compensating a circuit comprising:
    receiving a signal on a control terminal of a first transistor;
    coupling the signal to an output terminal through the first transistor;
    coupling the signal at the output terminal to a first terminal of a second transistor through a first capacitor;
    coupling the signal at the first terminal of the second transistor through the second transistor to the control terminal of the first transistor;
    coupling the signal at the output terminal to a load; and
    coupling the signal at the output terminal to a damping circuit comprising a second capacitor and a resistor,
    wherein the damping circuit comprises a third transistor having (i) a first terminal coupled to the output terminal, (ii) a second terminal coupled to a reference voltage, and (iii) a control terminal of the third transistor, wherein the second capacitor is coupled between the first terminal and the control terminal of the third transistor, and wherein the resistor is coupled between the control terminal of the third transistor and a current source.

15. The method of claim 11 further comprising coupling the first terminal of the second transistor to a current source.

16. The method of claim 14 wherein the second capacitor and the resistor modify an impedance of the load.

17. The method of claim 14 wherein the second capacitor and the resistor introduce a pole and a zero into a transfer function of the circuit.

18. The method of claim 14 wherein the second capacitor and the resistor are configured to produce the zero proximate to and above a gain bandwidth product of the circuit.

19. The method of claim 14 further comprising coupling the first terminal of the second transistor to the current source.

* * * * *